United States Patent
Tsuno et al.

(10) Patent No.: US 9,236,220 B2
(45) Date of Patent: Jan. 12, 2016

(54) ELECTRONIC MICROSCOPE, SETTING METHOD OF OBSERVATION CONDITION OF ELECTRONIC MICROSCOPE, AND OBSERVATION METHOD USING ELECTRONIC MICROSCOPE

(71) Applicant: Hitachi High-Technologies Corporation, Minato-ku, Tokyo (JP)

(72) Inventors: Natsuki Tsuno, Tokyo (JP); Hideyuki Kazumi, Tokyo (JP); Takafumi Miwa, Tokyo (JP); Yoshinobu Kimura, Tokyo (JP); Hajime Kawano, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/390,409

(22) PCT Filed: Apr. 3, 2013

(86) PCT No.: PCT/JP2013/060150
§ 371 (c)(1),
(2) Date: Oct. 3, 2014

(87) PCT Pub. No.: WO2013/151073
PCT Pub. Date: Oct. 10, 2013

(65) Prior Publication Data
US 2015/0041644 A1 Feb. 12, 2015

(30) Foreign Application Priority Data
Apr. 4, 2012 (JP) ................. 2012-085121

(51) Int. Cl.
*H01J 37/26* (2006.01)
*H01J 37/244* (2006.01)
*H01J 37/28* (2006.01)
*H01J 37/21* (2006.01)

(52) U.S. Cl.
CPC ............. *H01J 37/261* (2013.01); *H01J 37/244* (2013.01); *H01J 37/28* (2013.01); *H01J 37/21* (2013.01); *H01J 2237/2806* (2013.01); *H01J 2237/2809* (2013.01); *H01J 2237/2817* (2013.01); *H01J 2237/30472* (2013.01)

(58) Field of Classification Search
USPC .......................................... 250/310, 306, 307
See application file for complete search history.

(56) References Cited

U.S. PATENT DOCUMENTS

| | | | | |
|---|---|---|---|---|
| 5,160,884 | A | * 11/1992 | Todokoro et al. | ......... 324/754.21 |
| 8,907,279 | B2 | * 12/2014 | Tsuno et al. | .................. 250/307 |
| 2003/0193026 | A1 | 10/2003 | Takagi | |
| 2008/0116375 | A1 | 5/2008 | Ikegami et al. | |
| 2014/0097342 | A1 | 4/2014 | Tsuno et al. | |

FOREIGN PATENT DOCUMENTS

| | | |
|---|---|---|
| JP | 63-1040 A | 1/1988 |
| JP | 2001-338603 A | 12/2001 |

(Continued)

*Primary Examiner* — Kiet T Nguyen
(74) *Attorney, Agent, or Firm* — Miles & Stockbridge P.C.

(57) ABSTRACT

An automatic setting method of an observation condition to facilitate analysis of an image and a sample observation method by automatic setting in an observation method of a structure of a sample by the electronic microscope and an electronic microscope having an automatic setting function are provided. The method includes a step of irradiating a fixed position in an observation region with an intermittent pulsed electron beam; a step of detecting a time change of an emission electron from the sample by the intermittent electron beam; and a step of setting the observation condition of the electronic microscope from the time change of the emission electron.

17 Claims, 19 Drawing Sheets

(56) References Cited

FOREIGN PATENT DOCUMENTS

| JP | 2003-303566 A | 10/2003 |
| JP | 2003-331768 A | 11/2003 |
| JP | 2008-123716 A | 5/2008 |
| JP | 2012-252913 A | 12/2012 |

\* cited by examiner

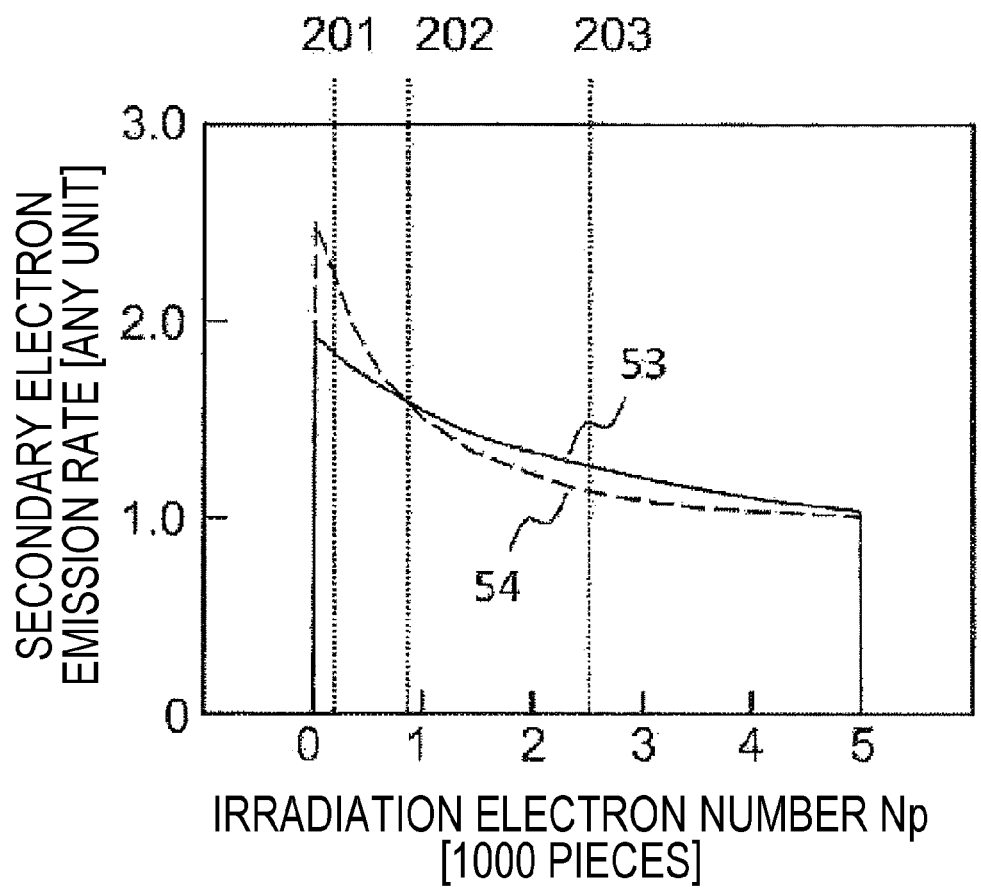

ELECTRONIC MICROSCOPE, SETTING METHOD OF OBSERVATION CONDITION OF ELECTRONIC MICROSCOPE, AND OBSERVATION METHOD USING ELECTRONIC MICROSCOPE

TECHNICAL FIELD

The present invention relates to microscope technology for observing a form of a sample using an electron beam and particularly, to technology for automatically setting an observation condition of a sample.

BACKGROUND ART

As a microscope that enables enlargement observation of a sample, an electronic microscope using an electron beam is known. In particular, a scanning electronic microscope (hereinafter, simply referred to as an SEM) that scans an electron beam on the sample and forms an image is used for observation of a minute surface shape or sample analysis such as local composition analysis. In the SEM, electron beams (hereinafter, referred to as primary electrons) accelerated by a voltage applied to an electron source are focused by an electron lens and the sample is irradiated with the electron beams. Electrons (Auger electrons, secondary electrons, reflected electrons, or secondary electrons and reflected electrons) emitted from the sample by the irradiation of the primary electrons are detected by a detector. Strength of a detection signal is converted into brightness of an image. The image is formed by a relation of the coordinates and the brightness under electron beam scanning. In the SEM, an image having high spatial resolution can be obtained by adjusting only a focus and a non-point. A function of adjusting an acceleration voltage of the primary electron or an illumination current in addition to the focus and the non-point is given to the SEM. In addition, there is an SEM to which a function of controlling a holding posture of the sample or switching a detector to be used is given.

As described above, because the electronic microscope has a large amount of adjustment parameters as compared with other enlargement observation devices such as an optical microscope, setting of an observation condition becomes complicated work to set a plurality of adjustment parameters while confirming an image. For this reason, adjustment values initially registered in a device are generally used in adjustment parameters other than the focus and the non-point. In addition, when the adjustment parameters are adjusted, the adjustment is made sensuously on the basis of the experience of a user.

PTL 1 discloses a method of forming images under a plurality of observation conditions to be registered in advance and displaying a plurality of images obtained under different observation conditions at the same time, as a function of assisting in setting the observation condition of the SEM. PTL 2 discloses a method of previously measuring a sample characteristic such as conductivity and analyzing an observation condition. PTL 3 discloses a method of previously estimating a sample characteristic using electron beams and analyzing an observation condition.

CITATION LIST

Patent Literature

PTL 1: JP 2003-303566 A
PTL 2: JP 2001-338603 A
PTL 3: JP 2003-331768 A

SUMMARY OF INVENTION

Technical Problem

When the focus and the non-point requiring minimum adjustment are adjusted in the SEM, the adjustment becomes setting work that is performed while an image is confirmed. For this reason, the setting work of the observation condition disclosed in PTL 1, PTL 2, and PTL 3 has the following problems.

Because imaging is necessary for setting the observation condition, sample pollution or damage is inevitable.

A long time is necessary for setting the observation condition and the throughput to the observation decreases.

An adjustment degree greatly depends on the experience of the user.

In addition, contrast of an image depends on characteristics (a surface shape, a composition, a crystal orientation, an electric field, and a magnetic field) of the sample and the peripheral portion of the sample and dependency of each of the characteristics for the contrast is different according to the observation condition. However, in the setting method of the observation condition in which only the focus or the non-point is adjusted and the initially registered adjustment values are used for the other adjustment parameters, performance of the SEM in which the observation based on the characteristics of the sample and the peripheral portion of the sample is enabled cannot be sufficiently used. In addition, when the initially registered observation condition or the sensible observation condition is used in observing the sample including an insulator, a high resistor, and an insulated floating region, the following problems occur.

Image drift, image distortion, and a brightness change of the image occur and the image is unstable.

An image according to a viewing method not assumed by the user is obtained and image analysis becomes difficult.

The viewing method of the image changes while the observation is repeated and reproducibility of the observation is insufficient.

An object of the invention is to provide a setting method of an observation condition of an electronic microscope capable of resolving the problems and extracting an observation condition automatically without acquiring an image, an observation method using an electronic microscope, and an electronic microscope having an automatic setting function of an observation condition.

Solution to Problem

In order to resolve the above-described problems, it becomes important that image acquisition is not necessary for setting an observation condition, a plurality of adjustment parameters to be the observation condition can be optimized, and an observation condition taking a time change of contrast into consideration can be set. A setting method of an observation condition of an electronic microscope according to the present invention includes a step of irradiating a predetermined position in an observation region with an intermittent pulsed electron beam (pulse electron); a step of analyzing a time change of an emission electron from the sample by the intermittent electron beam; and a step of setting the observation condition of the electronic microscope from the time change of the emission electron. According to the method, an observation condition can be set without acquiring an image and the observation condition taking a time change of contrast into consideration can be set. Therefore, an image suitable for observing a sample can be provided.

In addition, an observation method using an electronic microscope according to the present invention includes a step of intermittently irradiating a predetermined position in an observation region of a sample with an electron beam; a step of detecting a time change of an emission electron from the sample by the intermittent electron beam; a step of setting an observation condition from the time change of the emission electron; a step of acquiring an image under the observation condition; and a step of displaying the image. According to the method, a user can observe the sample without being troubled with setting of the observation condition.

In addition, an electronic microscope includes a means for emitting an electron beam; a means for controlling an irradiation position of the electron beam; a means for irradiating a sample with the electron beam; a means for detecting an emission electron from the sample; a means for holding the sample and moving the sample; a means for intermittently emitting the electron beam; a means for setting an intermittent condition of a pulse electron; a means for analyzing a time change of the emission electron; a means for setting the observation condition on the basis of a result of the analysis; a means for starting a sequence to set the observation condition; a means for acquiring an image under the observation condition; and a means for displaying the image.

Advantageous Effects of Invention

According to the invention, an observation condition can be optimized without acquiring an image and the observation condition taking a time change of contrast into consideration can be set. Therefore, an image suitable for observing a sample can be provided.

BRIEF DESCRIPTION OF DRAWINGS

FIG. 20 is a diagram illustrating a relation of a secondary electron emission rate and an irradiation electron number according to the fifth embodiment.

DESCRIPTION OF EMBODIMENTS

Hereinafter, embodiments of the present invention will be described using the drawings.

First Embodiment

Figure 1A:
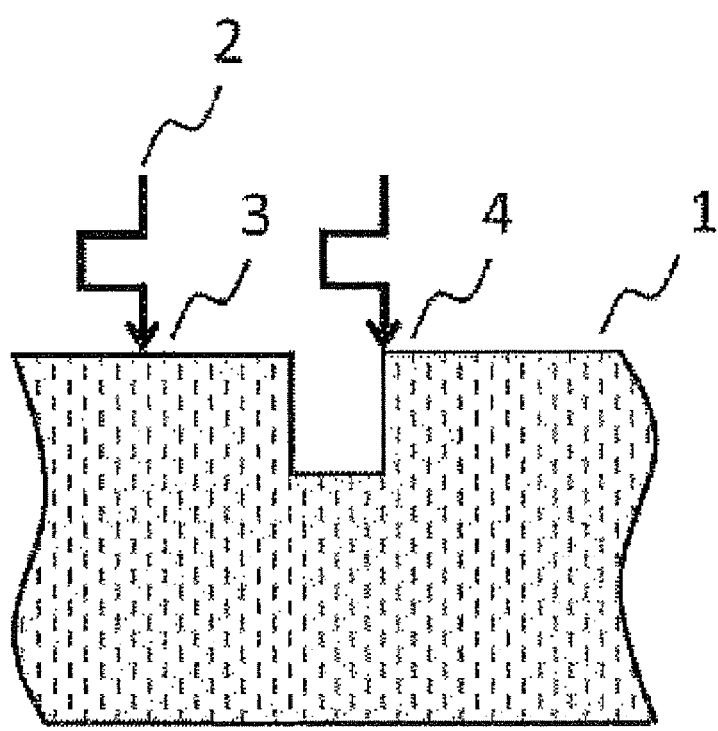
FIG. 1A is a diagram illustrating an example of a sample according to a first embodiment.
Figure 1B:
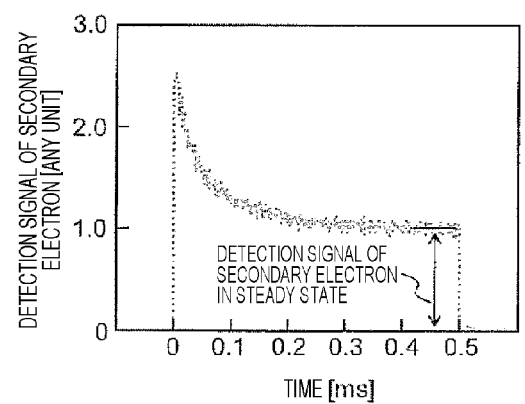
FIG. 1B is a diagram illustrating a time change of a secondary electron signal according to the first embodiment.

In this embodiment, a method and a device for setting an observation condition most suitable for observing a sample from a time change of a secondary electron among emission electrons will be described. As the observation sample in this embodiment, a sample in which an uneven pattern is formed on a surface of an insulator is used. FIG. 1A illustrates a cross-sectional view of a sample and an irradiation position of an intermittent pulsed electron beam (hereinafter, simply referred to as the pulse electron in embodiments) used for setting an observation condition. An insulator sample 1 is irradiated with a pulse electron 2 at a predetermined position set in advance and a time change of a secondary electron at each position is acquired. FIG. 1B illustrates an example of a time change of a detection signal of the secondary electron by the irradiation of the pulse electron. The signal of the secondary electron by the irradiation of the pulse electron attenuates after the irradiation of the electron beam starts and becomes steady by the irradiation of a constant time. In this embodiment, the detection signal of the secondary electron is analyzed quantitatively to raise extraction precision of the observation condition. In an insulator having the thickness at which an electron beam is not transmitted, when a detection signal of the secondary electron becomes steady, an illumination current Ip of the primary electron and an emission current of the secondary electron from the sample are balanced. The detection signal of the illumination current Ip can be analyzed from the strength of the detection signal when the detection signal of the secondary electron becomes steady. An emission rate of the secondary electron is a ratio of an emission amount of the secondary electron for an irradiation amount of the primary electron and can be analyzed by an expression (1).

Emission rate of secondary electron=detection signal of secondary electron/detection signal of illumination current $Ip$ (expression 1)

Figure 2:
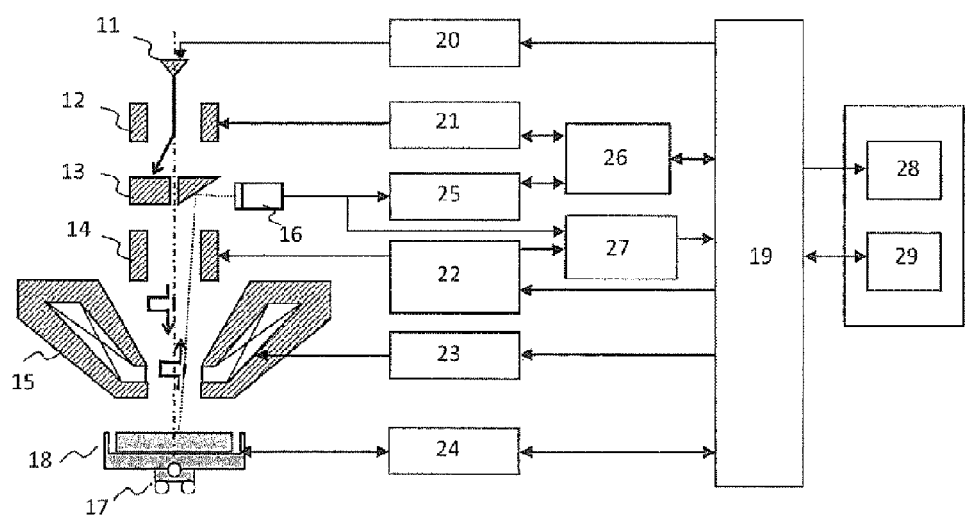
FIG. 2 is a structural diagram illustrating an example of an electronic microscope according to the present invention.

FIG. 2 illustrates a configuration example of the scanning electronic microscope in this embodiment. The scanning electronic microscope is configured by an electronic optical system, a stage mechanism system, an SEM control system, and an SEM operation system.

The electronic optical system is configured by an electron gun 11, a pulse electron generator 12, a diaphragm 13, a deflector 14, an objective lens 15, and a detector 16.

The stage mechanism system is configured by a sample holder 17 and a sample 18 on a stage of XYZ axes where inclination control is enabled. The SEM control system is configured by an electron gun control unit 20, a pulse electron control unit 21, a deflection scanning signal control unit 22, an objective lens coil control unit 23, a stage control unit 24, a detection signal processing unit 25, an adjustment parameter analyzing unit 26, and a device control unit 19 that manages an adjustment value of each control unit parameter and sets the adjustment value to a device.

An image processing system is configured by an image forming unit 27. An operation system is configured by an operation interface 28 and an image display unit 29.

In the present invention, the pulse electron generator 12 is provided separately. However, the present invention can be embodied using an electron gun that enables irradiation of an electron in a form of a pulse. In this case, the pulse electron control unit 21 can be embedded in the electron gun control unit 20.

Figure 3:
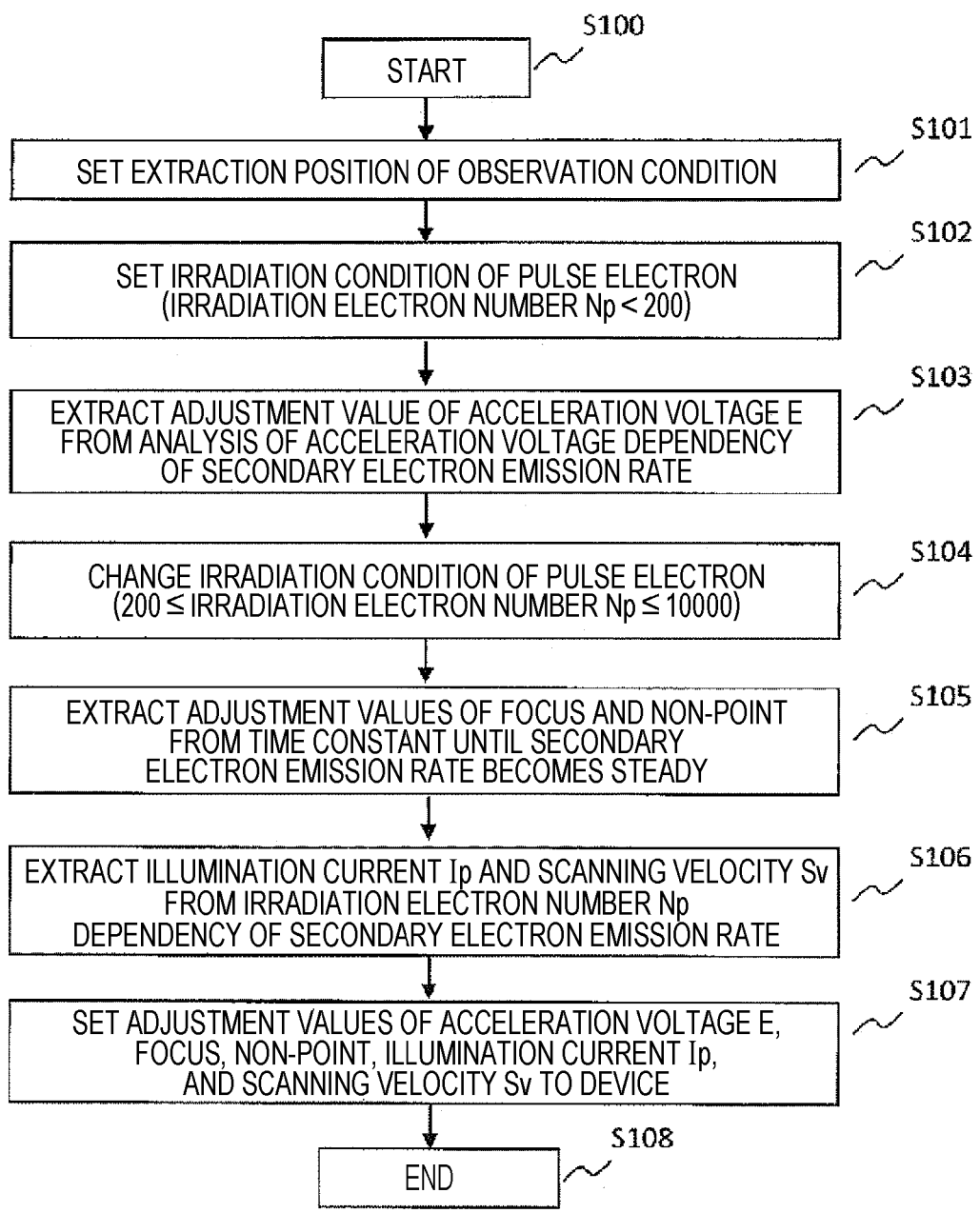
FIG. 3 is a diagram illustrating an example of an adjustment method of an observation condition according to the first embodiment.

FIG. 3 illustrates an example of a flow to optimize an acceleration voltage, a focus, a non-point, an illumination current, and a scanning velocity to be observation conditions. In this embodiment, an example of optimization of observation conditions to measure a surface shape of a sample will be described. An automatic setting flow of the observation condition is started by a start button mounted to the operation interface 28 (S100). An extraction position of the observation condition is set (S101). In this embodiment, two positions of a flat portion 3 and a shape end portion 4 illustrated in FIG. 1 are set. When the positions are set, the positions are confirmed by the optical microscope in advance and the positions are determined. When the positions are fixed, the irradiation position of the pulse electron is fixed by the deflection scanning signal control unit 22 and the deflector 14. Next, the irradiation condition of the pulse electron is set (S102). In a floating conductor not connected to a ground, a semiconductor, and an insulator, if electrons of an irradiation electron number (hereinafter, simply referred to as Np) of 200 or more are irradiated, surface charging is generated by irradiation of electron beams and the secondary electron emission rate changes. An evaluation of acceleration voltage dependency of the secondary electron emission rate becomes difficult due to an influence of the surface charging. In order to evaluate the acceleration voltage dependency of the secondary electron emission rate, the irradiation condition of the pulse electron is set such that Np becomes less than 200. In this embodiment, Np is 60, an illumination current of the pulse electron is 20 pA, and an irradiation time of the pulse electron is 500 ns. The irradiation condition of the pulse electron is registered in the device control unit 19 in advance. An irradiation time of the pulse electron is controlled by the pulse electron control unit 21. An adjustment value of the acceleration voltage E is extracted from the analysis of the acceleration voltage dependency of the secondary electron emission rate (S103). The acceleration voltage dependency of the secondary electron emission rate is analyzed by the detection signal analyzing unit 25.

Figure 4:
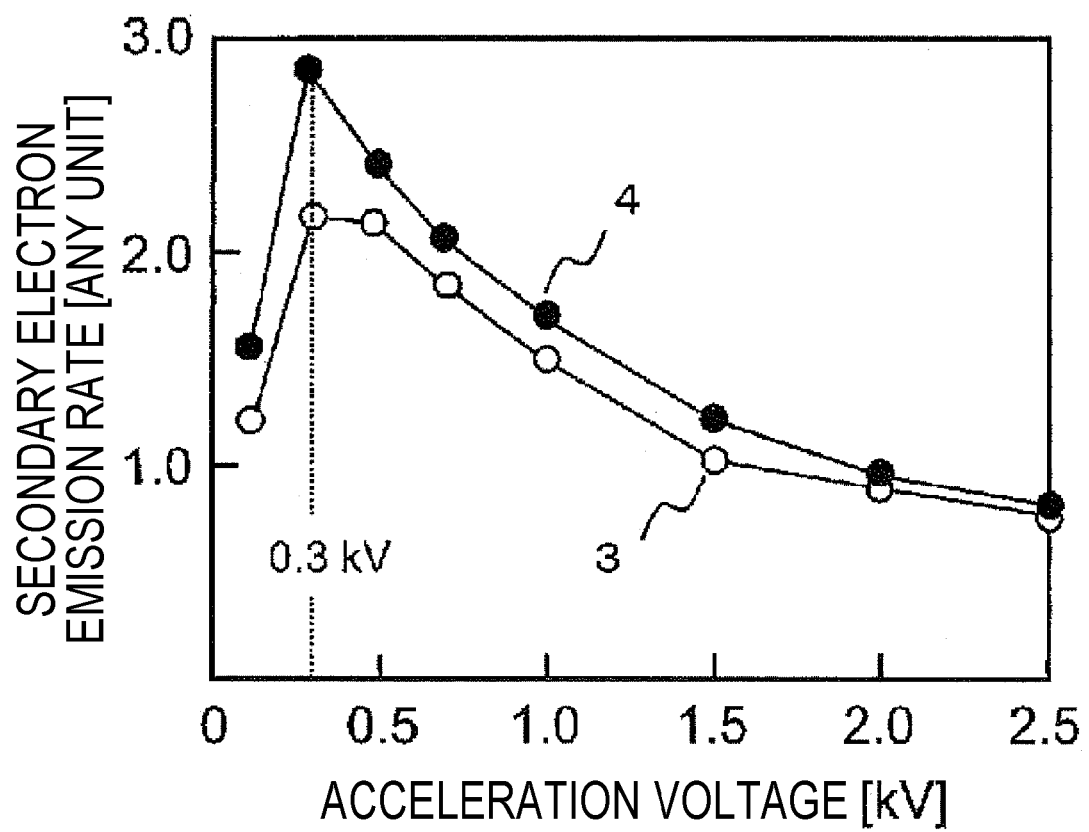
FIG. 4 is a diagram illustrating a relation of a secondary electron emission rate and an acceleration voltage according to the first embodiment.

The acceleration voltage dependency of the secondary electron emission rate is illustrated in FIG. 4. A difference of secondary electron emission rates of the flat portion 3 and the end portion 4 is maximized at an acceleration voltage of 300 V. The difference of the secondary electron emission rates is reflected in the contrast of the image. The acceleration voltage of 300 V at which the difference of the secondary electron emission rates in the flat portion and the end portion of FIG. 1A is maximized is extracted by the adjustment parameter analyzing unit 26.

Next, the irradiation condition of the pulse electron is changed (S104). The focus and the non-point are analyzed from a time constant when the secondary electron emission rate changes temporally by the surface charging by the irradiation of the electron beams in Np in which the sample surface is charged. Np in which charging by the irradiation of the electron beam affects the secondary electron emission rate is from 200 to 10,000. In this embodiment, Np is 600 (an illumination current is 20 pA and an irradiation time is 50 μs).

Figure 5A:
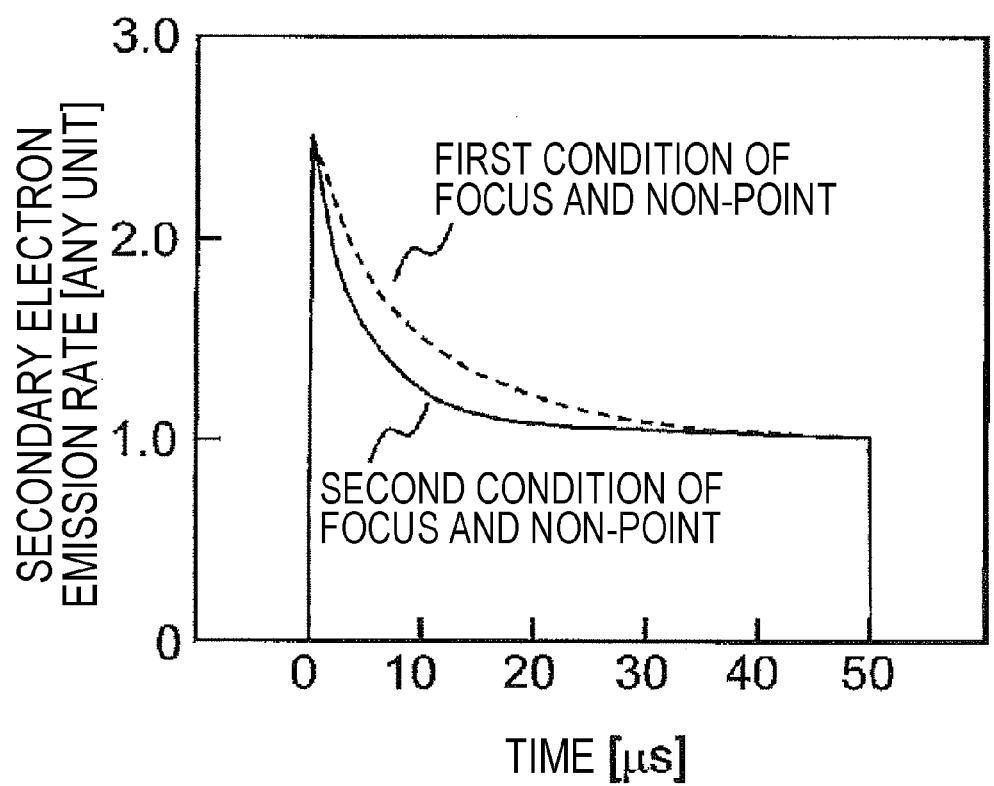
FIG. 5A is a diagram illustrating an extraction method of adjustment values of a focus and a non-point according to the first embodiment.
Figure 5B:
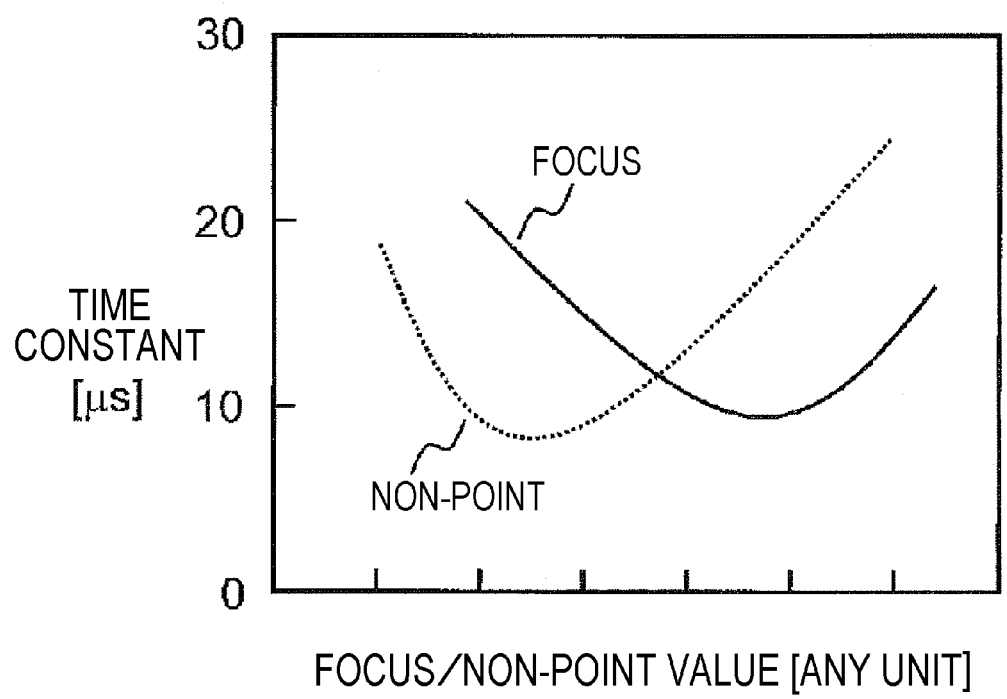
FIG. 5B is a diagram illustrating an extraction method of adjustment values of a focus and a non-point according to the first embodiment.

FIG. 5A illustrates time changes of secondary electron emission rates acquired under two conditions of the focus and the non-point. A time constant until the secondary electron emission rate becomes steady is different in a first condition of the focus and the non-point and a second condition of the focus and the non-point. When an area of an irradiation region decreases, the time constant until the secondary electron emission rate becomes steady decreases. By analyzing a minimum value of the time constant, adjustment values of the focus and the non-point can be optimized. FIG. 5B illustrates a relation of a time constant and values of the focus and the non-point. Adjustment values of the focus and the non-point are extracted from the result (S105).

Figure 6:
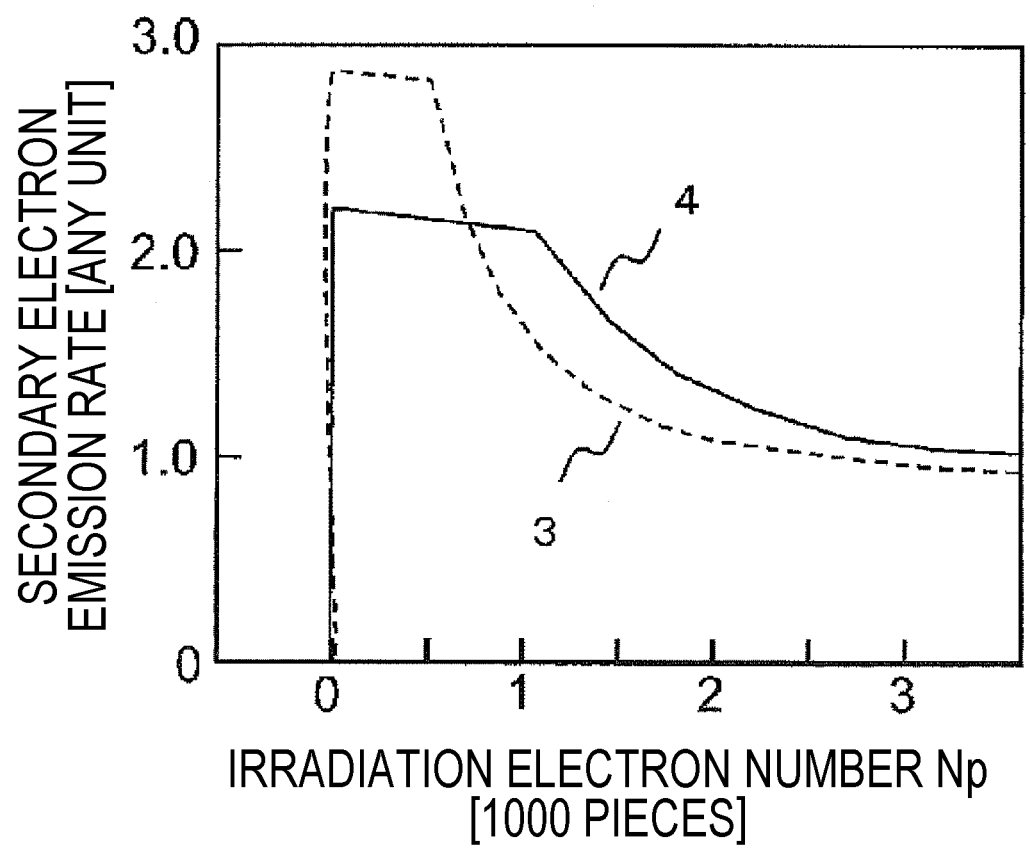
FIG. 6 is a diagram illustrating a relation of a secondary electron emission rate and an irradiation electron number according to the first embodiment.

Next, the illumination current Ip and the scanning velocity Sv of the electron beam are extracted from the dependency of the irradiation electron number Np of the secondary electron emission rate (S106). The dependency of the irradiation electron number Np of the secondary electron emission rate can be analyzed from a time change (irradiation electron number Np=illumination current Ip×time/elementary charge e) of the secondary electron emission rate. FIG. 6 illustrates dependency of the irradiation electron number Np of the secondary electron emission rate. The secondary electron emission rates of the flat portion 3 and the end portion 4 illustrated in FIG. 1A become almost constant when Np are 500 or less and 1,000 or less, respectively, and the difference of the secondary electron emission rates of the flat portion 3 and the end portion 4 decreases when Np are 1,000 or more. Optimal Np of an observation condition for emphasizing shape contrast is 500 in which the difference of the secondary electron emission rates in the flat portion 3 and the end portion 4 is maximized. In this embodiment, if the illumination current Ip is set previously as the observation condition, the scanning velocity Sv of the electron beam is acquired from an expression (2).

$Sv=F/(P\times Np\times e/Ip)$ (expression 2)

Here, P is a pixel number of one side of an image, e is an elementary charge, and F is a visual field. F is determined by observation magnification designated by the user. In this embodiment, if Ip is set to 20 pA in advance, the visual field is set to 10 µm, and the pixel number of one side is set to 512, the scanning velocity can be extracted as 0.3 µm/µs. In addition, the illumination current may be changed by setting the scanning velocity in advance. Adjustment values of the extracted acceleration voltage, focus, non-point, illumination current, and scanning velocity are set from the device control unit 19 to the device (S107).

In this way, the acceleration voltage, the illumination current, the scanning velocity, the focus, and the non-point are optimized and the automatic setting flow of the observation condition ends (S108).

Figure 7A:
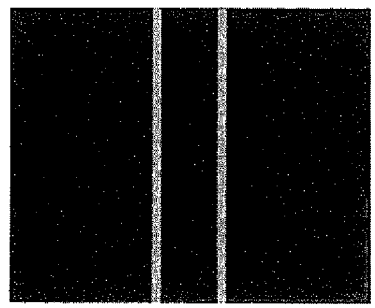
FIG. 7A is a diagram illustrating an example of an image acquired under an observation condition initially registered to an SEM.
Figure 7B:
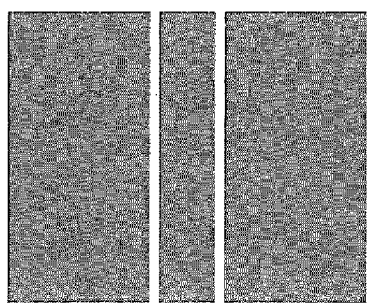
FIG. 7B is a diagram illustrating an example of an image acquired using automatic setting technology of an observation condition according to the first embodiment.

FIGS. 7A and 7B illustrate an image (FIG. 7A) acquired under the observation condition initially registered in the SEM and an image (FIG. 7B) acquired using automatic setting technology of the observation condition according to this embodiment. In the SEM image, a bright signal is obtained at the end portion of the groove of the sample 1 of FIG. 1. In FIG. 7B, contrast is high and the width of the groove can be easily recognized, as compared with FIG. 7A.

As such, if this embodiment is used, the observation condition can be automatically set by the time change of the secondary electron at the fixed position in the observation region. The observation condition can be optimized without acquiring the image and an image in which the contrast corresponding to the information of the sample is emphasized can be acquired.

Second Embodiment

Figure 8:
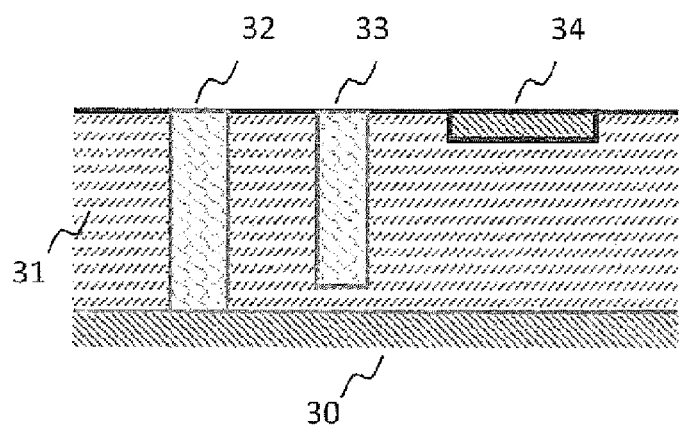
FIG. 8 is a diagram illustrating an example of a sample according to a second embodiment.

In this embodiment, a method and a device for setting an observation condition most suitable for observing a sample from a time change of a detection signal of a secondary electron will be described. In this embodiment, a semiconductor device in which a contact plug is formed in an insulator is targeted. FIG. 8 illustrates an observed sample. A contact plug made of polysilicon and a metal wiring line are formed in an insulating film 31 formed on a silicon substrate 30. A contact plug 32 is electrically connected to the silicon substrate 30. However, because the polysilicon is inactivated, the contact plug 32 has a high resistance value. A contact plug 33 does not contact the silicon substrate 30 and does not become conductive. A metal wiring line 34 is a floating wiring line that is not connected to a ground.

A configuration example of a scanning electronic microscope in this embodiment is the same configuration as the configuration of FIG. 2 illustrated in the first embodiment. In this embodiment, a start button of automatic setting of an observation condition is arranged in an operation graphic user interface (GUI).

Figure 9:
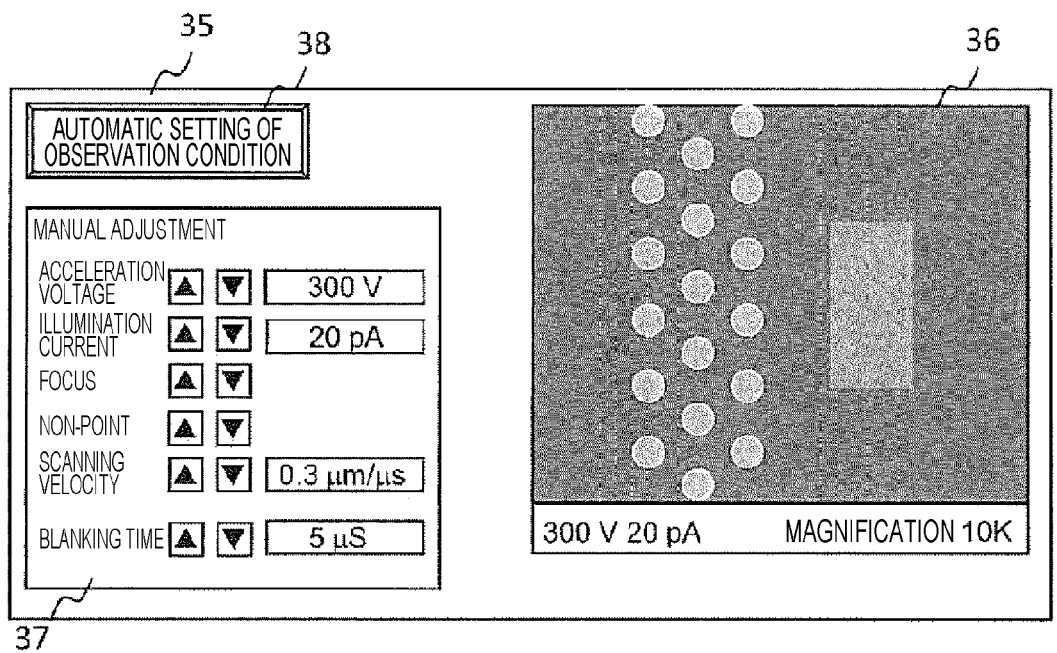
FIG. 9 is a diagram illustrating an example of an operation GUI according to the second embodiment.

FIG. 9 illustrates a GUI to which an automatic setting function of an observation condition is given. An image display unit 36 of the SEM and a manual adjustment 37 allowing a user to set the observation condition manually are given to an operation GUI 35.

In a versatile SEM, an acceleration voltage, an illumination current, a focus, and a non-point are general adjustment items. However, in this embodiment, the acceleration voltage, the illumination current, the focus, the non-point, a scanning velocity, and a blanking time are included in the manual adjustment 37. The blanking time is a time for which an electron beam is interrupted at the time of scanning the electron beam or image acquisition (frame). A start button 38 of automatic setting of an observation condition is given to the operation GUI 35. If the automatic extraction of the observation condition starts, the manual adjustment 37 is inactivated.

Figure 10:
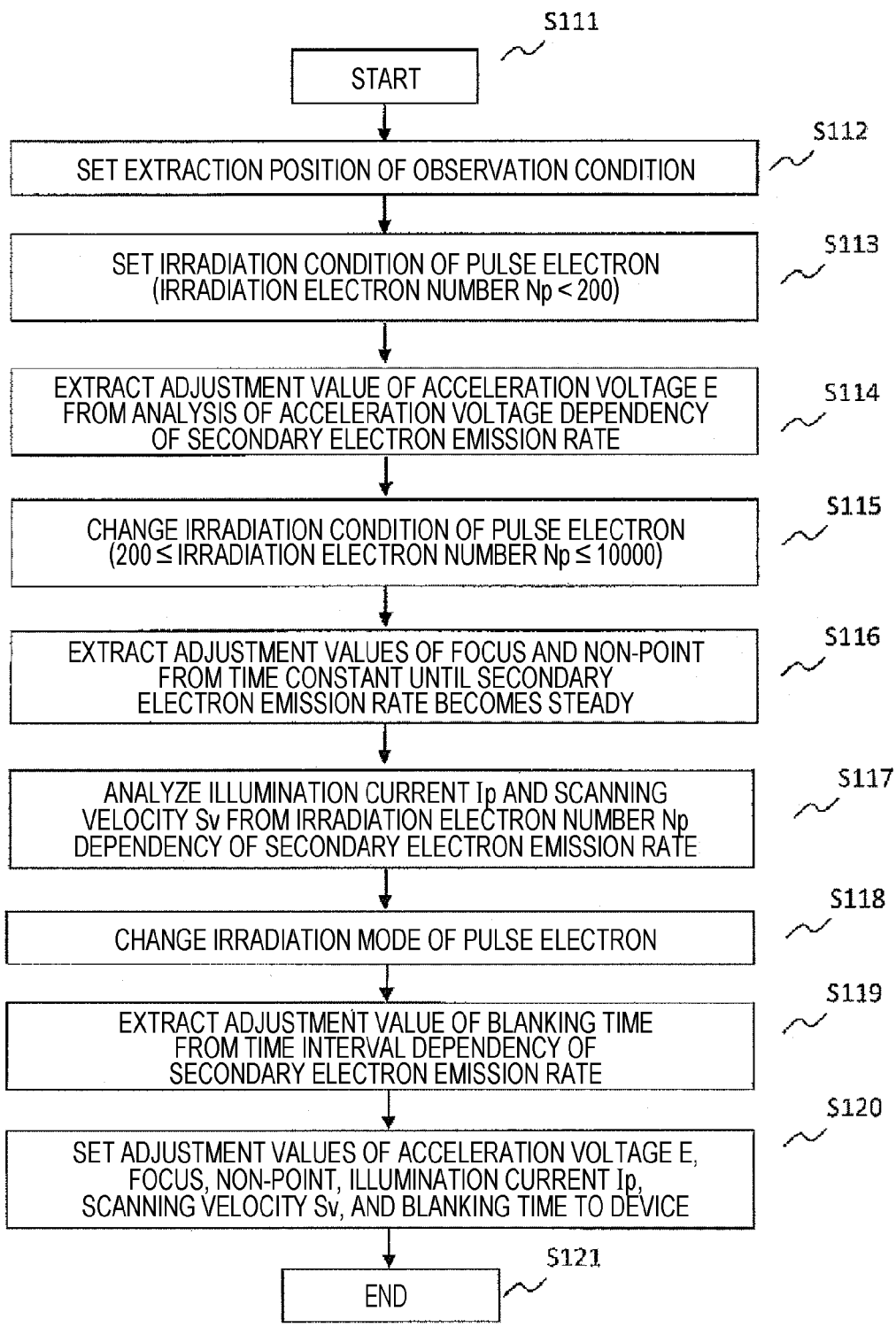
FIG. 10 is a diagram illustrating an example of an adjustment method of an observation condition according to the second embodiment.

FIG. 10 illustrates an example of a flow to optimize the acceleration voltage, the focus, the non-point, the illumination current, the scanning velocity, and the blanking time at the time of the scanning, which are the observation conditions. In this embodiment, an example of optimization of the observation condition to identify the electrically connected contact plug, the electrically non-connected contact plug, and the floated metal wiring line in the sample is described. The same flow as the flow of FIG. 3 is used from the start of the automatic setting flow of the observation condition of FIG. 10 (S111) to the extraction of the adjustment values of the focus and the non-point (S116).

Figure 11:
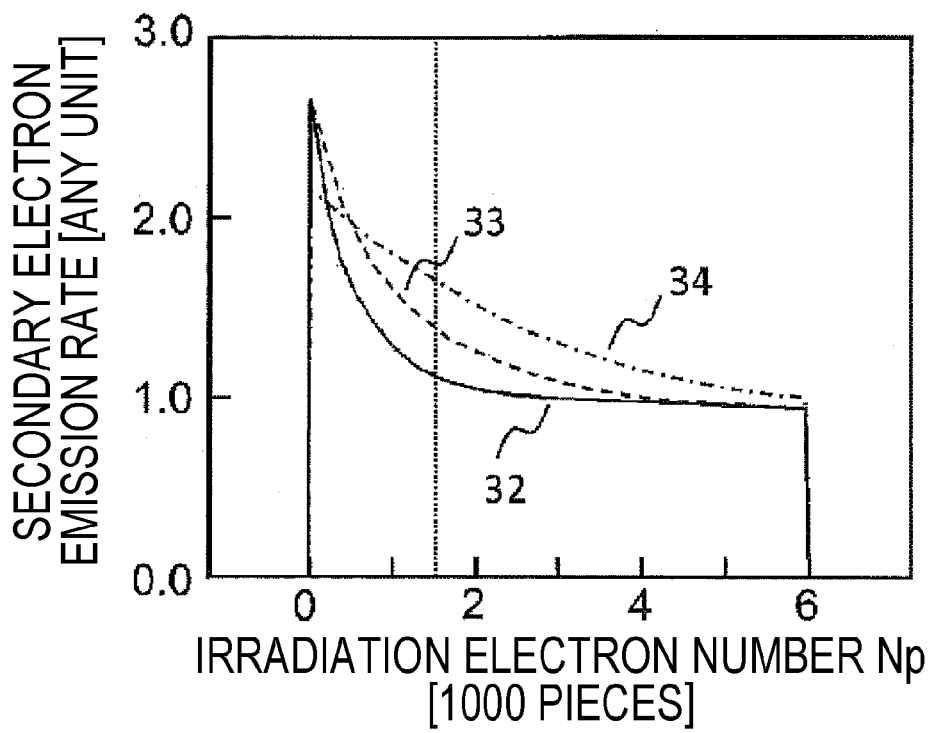
FIG. 11 is a diagram illustrating a relation of a secondary electron emission rate and an irradiation electron number according to the second embodiment.

A method of analyzing/extracting adjustment values of the illumination current Ip and the scanning velocity Sv from the dependency of an irradiation electron number Np of a secondary electron emission rate (S117) will be described using FIG. 11. FIG. 11 illustrates the dependency of the irradiation electron number Np of the secondary electron emission rate acquired by the electrically connected contact plug, the electrically non-connected contact plug, and the floated metal wiring line. When the irradiation electron number Np is 1,500, the difference of the secondary electron emission rates in the electrically connected contact plug, the electrically non-connected contact plug, and the floated metal wiring line is maximized. The illumination current Ip and the scanning velocity to realize the irradiation electron number Np=1,500 are 20 pA and 0.9 µm/µs, respectively. Next, an irradiation mode of a pulse is changed (S118). A plurality of pulse electrons having different intermittent conditions of pulse electrons are irradiated. The first pulse electron is a pulse electron (referred to as a pump pulse) that induces an electron beam irradiation effect such as charging or a magnetic domain change and the second pulse electron is a pulse electron (referred to as a probe pulse) that detects the effect induced by the pump pulse. The pump pulse is irradiated and then the probe pulse is irradiated at a predetermined time interval (this method is referred to as a pump probe method). In the pump probe method, the time change such as the charging or the magnetic domain change by the irradiation of the electron beam can be analyzed. In this embodiment, the charging by the irradiation of the electron beam is focused.

Figure 12:
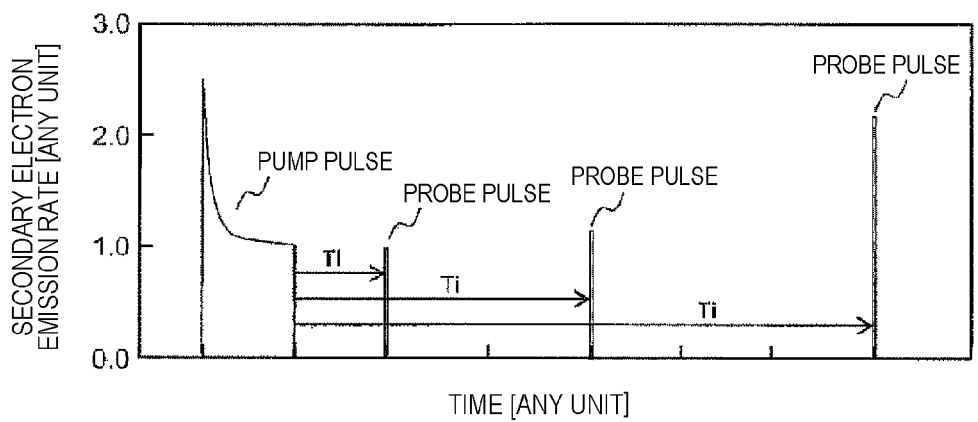
FIG. 12 is a diagram illustrating an example of a pump probe according to the second embodiment.

A time change of the secondary electron emission rate obtained by the pump probe method is illustrated in FIG. 12. Generally, an irradiation time is controlled long in the pump pulse, as compared with the probe pulse. In this embodiment, the pump pulse is set to the irradiation electron number depending on the scanning velocity of the electron beam. In addition, 10 µs to realize the irradiation electron number Np=1,500 analyzed in S117 is set as an irradiation time of the pump pulse. In the probe pulse, 500 ns to realize the irradiation electron number Np=60 is set as the irradiation time of the probe pulse to suppress the electron beam irradiation effect as much as possible. As a time interval Ti of the pump pulse and the probe pulse increases, a secondary electron emission rate of the probe pulse increases. This is because charging generated by the pump pulse is alleviated as the time interval increases and the secondary electron emission rate increases. An alleviation effect of the charging is analyzed from the time interval dependency of the secondary electron emission rate of the probe pulse.

Figure 13:
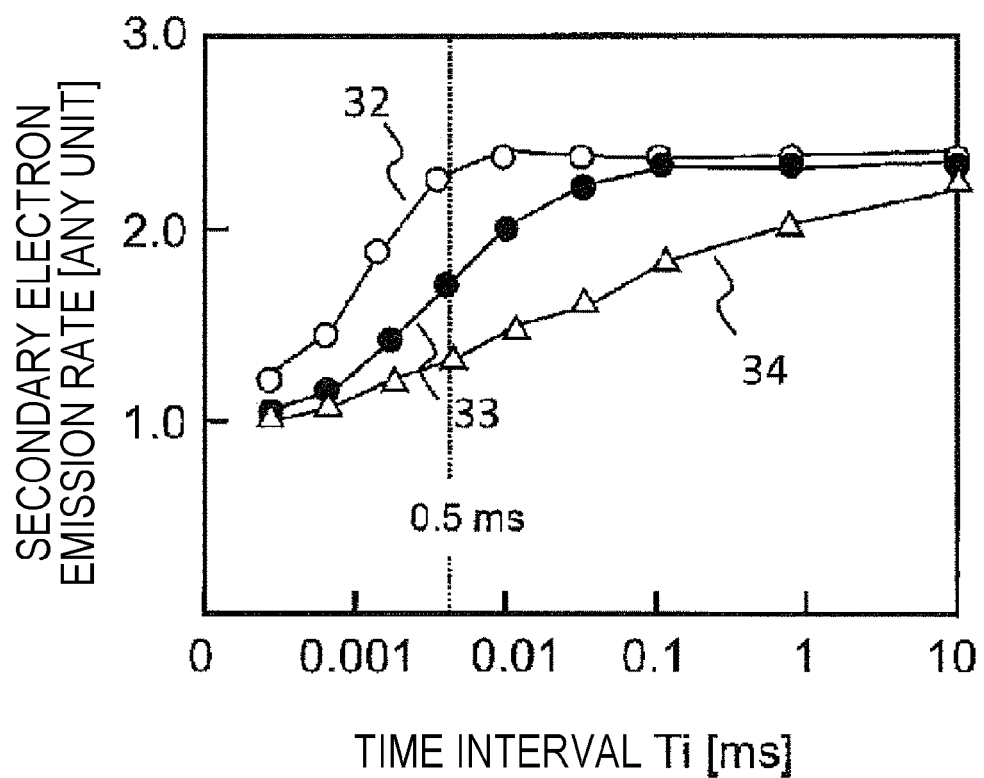
FIG. 13 is a diagram illustrating a relation of a secondary electron emission rate and a time interval according to the second embodiment.

FIG. 13 illustrates the time interval dependency of the secondary electron emission rate of the probe pulse that is acquired by the electrically connected contact plug, the electrically non-connected contact plug, and the floated metal wiring line. The time change of the probe pulse decreases in order of the electrically connected contact plug, the electrically non-connected contact plug, and the floated metal wiring line. Because a difference of secondary electron emission rates in the electrically connected contact plug, the electrically non-connected contact plug, and the floated metal wiring line is maximized at the time interval of 0.005 ms, the blanking time is optimal at 0.005 ms and is set to a blanking time between the scanning and the scanning in this embodiment. Therefore, an adjustment value of the blanking time can be extracted from the time interval dependency of the secondary electron emission rate (S119). In this embodiment, the scanning velocity Sv and the blanking time are analyzed separately. However, the scanning velocity Sv may be analyzed from the time change of the secondary electron emission by the pump pulse. The extracted adjustment values of the acceleration voltage, the illumination current, the scanning velocity, the focus, the non-point, and the blanking time are set from the device control unit 19 to the device (S120) and the automatic setting flow of the observation condition ends (S121). As such, if this embodiment is used, an observation condition for acquiring an image enabling identification of each region in a sample having regions with different characteristics can be automatically set.

Third Embodiment

Figure 14A:
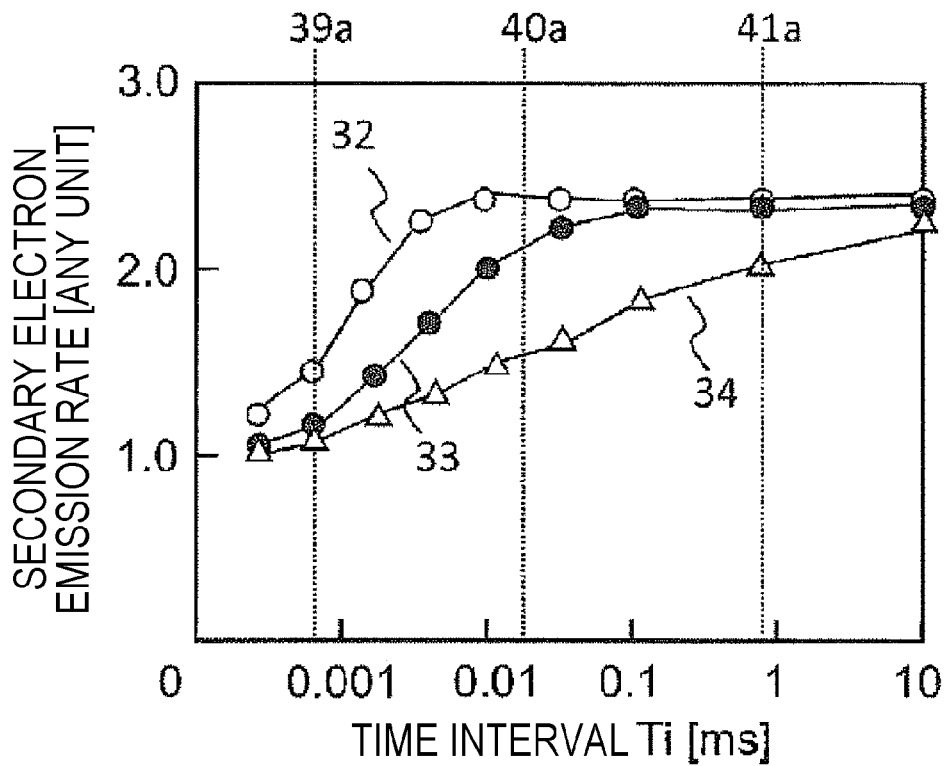
FIG. 14A is a diagram illustrating a relation of a secondary electron emission rate and a time interval according to a third embodiment.
Figure 14B:
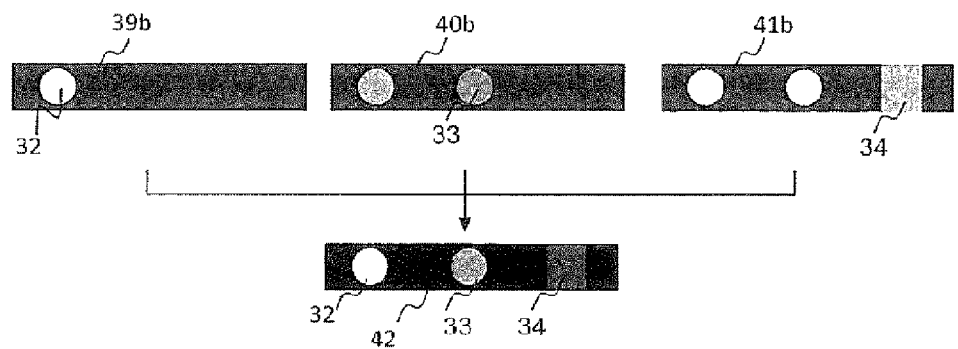
FIG. 14B is a diagram illustrating an example of a combination method of an image according to the third embodiment.

In this embodiment, a method of acquiring an image in which a characteristic of a sample is reflected, by analyzing a plurality of automatically extracted observation conditions, will be described. In this embodiment, the same sample as the sample in the second embodiment illustrated in FIG. 8 is used. The same device as the device in the first embodiment illustrated in FIG. 2 is used as a device used in this embodiment and the same GUI as the GUI in the second embodiment illustrated in FIG. 9 is used as an operation GUI. FIGS. 14A and 14B illustrate a method of acquiring an image in which a characteristic of the sample is reflected, by analyzing the plurality of observation conditions and executing an image process. A plurality of blanking times are extracted from time interval dependency of a secondary electron emission rate of a probe pulse illustrated in FIG. 14A.

In this embodiment, three blanking times are extracted and are set as a first observation condition 39a, a second observation condition 40a, and a third observation condition 41a. As illustrated in FIG. 14B, an image 39b acquired under the first observation condition 39a, an image 40b acquired under the second observation condition 40a, and an image 41b acquired under the third observation condition 41a are acquired. Each image is weighted according to the blanking time and a combined image 42 is formed. Electric characteristics in discharging of an electrically connected contact plug 32, an electrically non-connected contact plug 33, and a floated metal wiring line 34 are included in the combined image 42 and a time constant of discharging of each region is reflected in the brightness of images of the electrically connected contact plug 32, the electrically non-connected contact plug 33, and the floated metal wiring line 34. As such, an image in which a characteristic of a sample is quantitatively reflected can be acquired by quantitative analysis of a secondary electron emission rate and weighting of an adjustment parameter value.

Fourth Embodiment

Figure 15:
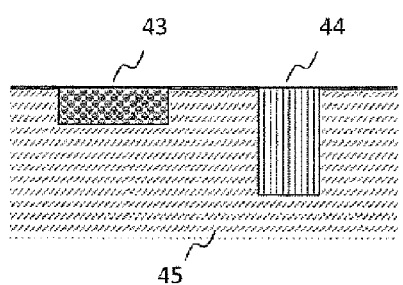
FIG. 15 is a diagram illustrating an example of a sample according to a fourth embodiment.
Figure 16:
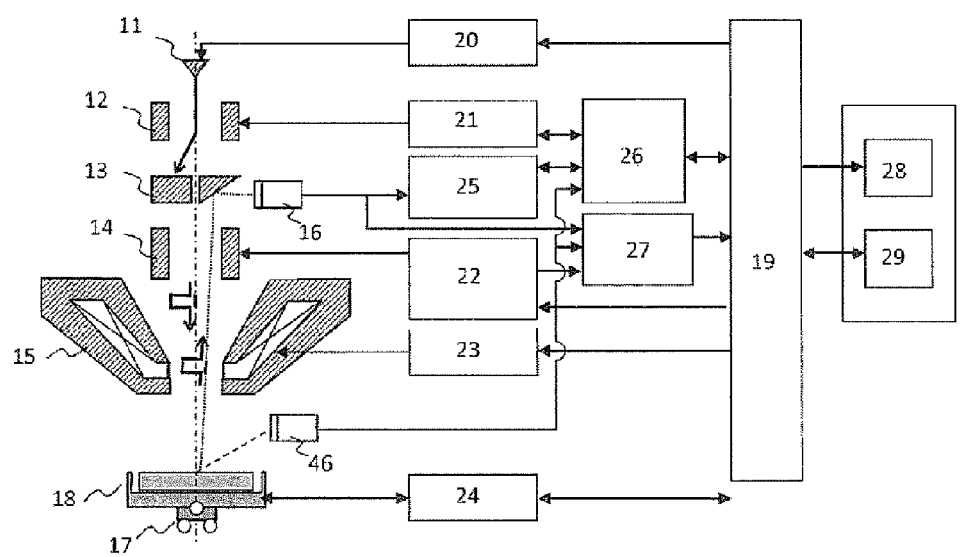
FIG. 16 is a structural diagram illustrating an example of an electronic microscope according to the present invention.

In this embodiment, automatic extraction of an observation condition in a sample in which a plurality of contrasts are overlapped will be described. FIG. 15 illustrates a sample used in this embodiment. A magnetic material 43 and a conductor 44 are samples that are included in an insulator 45. A device used in this embodiment is illustrated in FIG. 16. The device has a structure in which a plurality of detectors are arranged in the device according to the first embodiment illustrated in FIG. 2. In this embodiment, a reflected electron detector 46 is arranged in an oblique lateral direction of a sample. The reflected electron detector has almost the same structure as a structure of a detector 16 for a secondary electron. However, because energy incident on the detectors is different, voltages applied to the detectors are different. In addition, in a structure in which an energy filter is arranged in front of the detector, a reflected electron can be detected with high sensitivity. In addition to the reflected electron detector arranged in this embodiment, a mode detector detecting a spin of the sample or an electron backscatter diffraction detector can be used.

Figure 17:
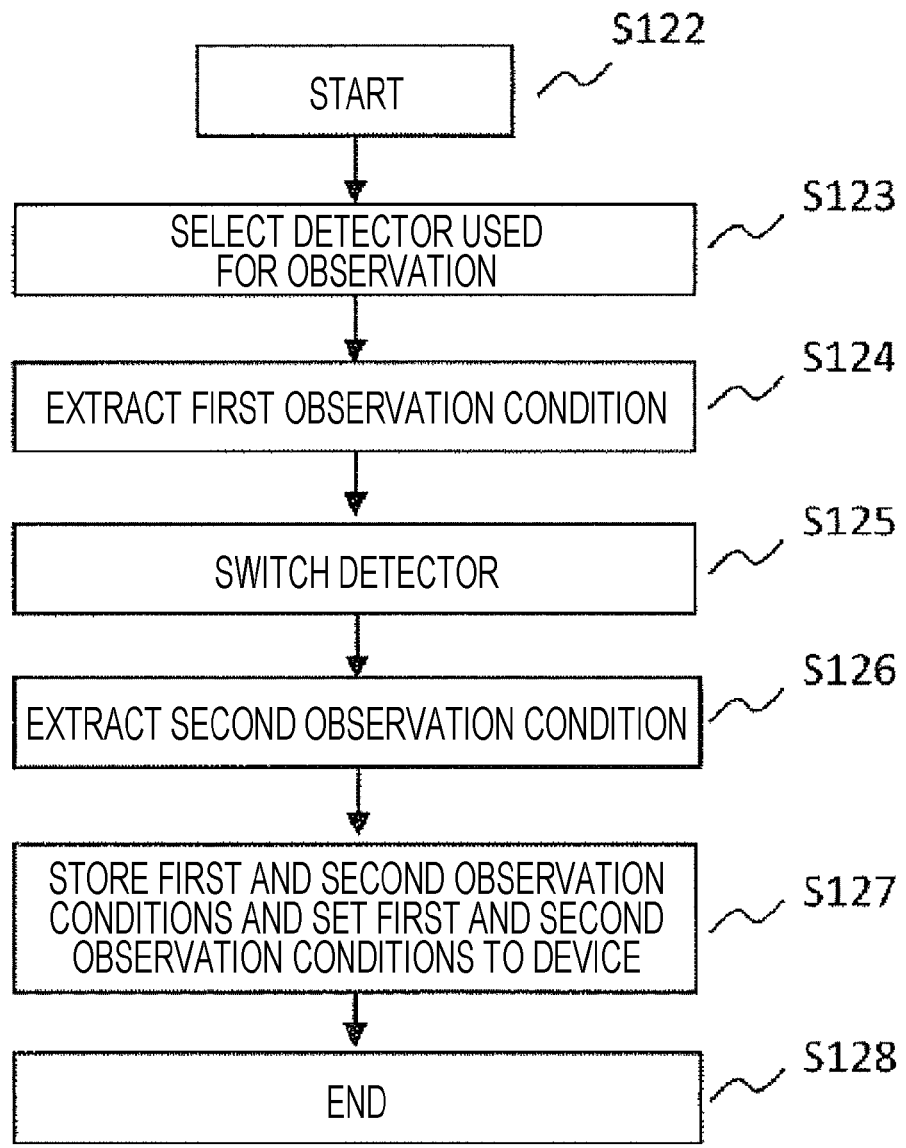
FIG. 17 is a diagram illustrating an example of an adjustment method of an observation condition according to the fourth embodiment.

FIG. 17 illustrates a flow for setting an observation condition for each detector. If the automatic setting flow of the observation condition starts (S122), the detector used for the observation condition is selected (S123). When design data of the sample is previously input, the detector may be selected according to a material of an observation portion. In addition, all detectors mounted to the device may be selected. In this embodiment, two detectors of the detector 16 for the secondary electron and the detector 46 for the reflection electron are selected. In this embodiment, the first observation condition is extracted such that magnetic contrast is emphasized (S124). Then, the detector is switched (S125) and the second observation condition is extracted such that composition contrast is emphasized (S126). The first and second observation conditions are stored in a device control unit 19 and one of the first and second observation conditions is set to the device (S127). The automatic setting flow of the observation condition ends (S128). However, when the observation is made, the observation conditions stored in the device control unit 19 are sequentially set to the device and an image is acquired.

Figure 18:
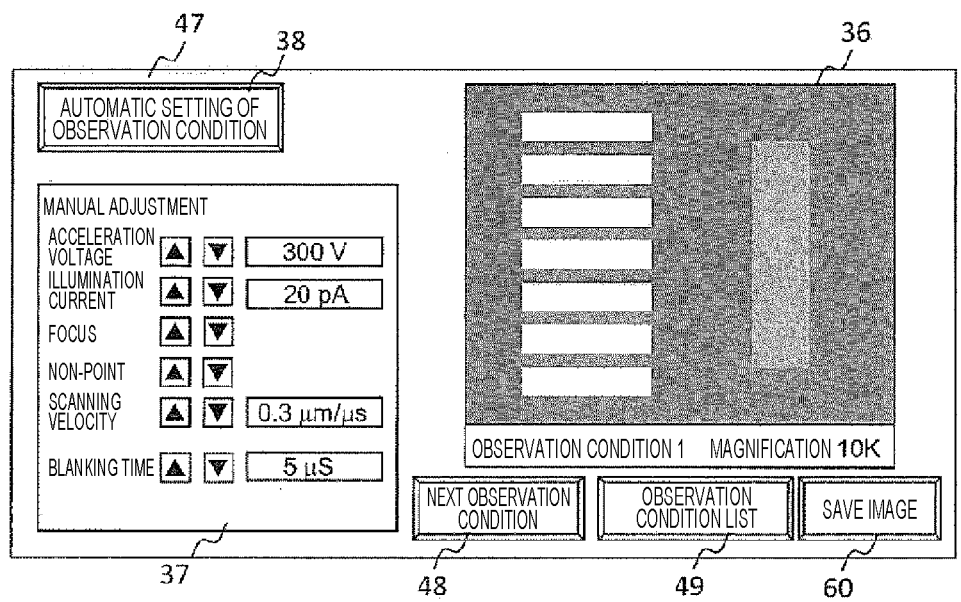
FIG. 18 is a diagram illustrating an example of an operation GUI according to the fourth embodiment.

An example of an operation GUI in this embodiment is illustrated in FIG. 18. The priority of the image acquired under the observation condition is determined by an observation history of the sample or selection of a user and the image is displayed on the operation GUI 47. An image acquired under a next observation condition can be displayed by a button 48 and images acquired under all observation conditions can be displayed by a button 49. In addition, a user can select a desired image from the displayed images and an image can be stored by a button 60. As such, images in which emphasized contrast is different can be acquired by automatically extracting observation conditions for every plural detectors and the user can obtain an appropriate image without being troubled with the selection of the observation condition and the detector.

Fifth Embodiment

Figure 19:
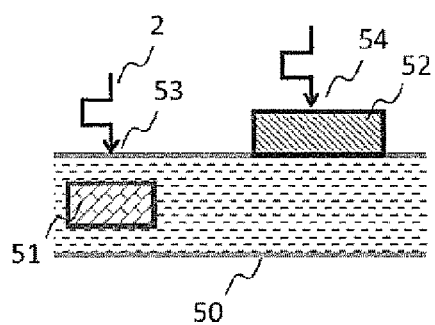
FIG. 19 is a diagram illustrating an example of a sample according to a fifth embodiment.

In this embodiment, automatic setting of an observation condition in a sample in which a plurality of contrasts are overlapped will be described. In this embodiment, automatic setting of an observation condition using a single detector will be described. A device used in this embodiment is the same device as the device in the first embodiment illustrated in FIG. 2 and the same GUI as the GUI in the fourth embodiment illustrated in FIG. 18 is used as an operation GUI. FIG. 19 illustrates an observation sample. A dielectric material 51 is buried in an insulating film 50 and a different dielectric material 52 is formed on the insulating film 50. Irradiation positions of pulse electrons are a position 53 on the dielectric material 51 and a position 54 on the dielectric material 52.

FIG. 20 illustrates dependency of irradiation electron numbers Np of secondary electron emission rates acquired at the positions 53 and 54 of the pulse electrons. A first observation condition 201 in which the secondary electron emission rate of the position 54 on the dielectric material 52 increases, a second observation condition 202 in which the secondary electron emission rates of the position 53 on the dielectric material 51 and the position 54 on the dielectric material 52 become the same, and a third observation condition 203 in which the secondary electron emission rate of the position 53 on the dielectric material 51 increases are extracted. In addition to the acceleration voltage, the illumination current, the scanning velocity, the focus, and the non-point described in the first embodiment, amplification gain of a detector and an offset value of a signal are adjusted as observation conditions. The adjustment is performed such that a secondary electron signal in a range of the secondary electron emission rates analyzed in FIG. 20 is amplified linearly.

Figure 21A:
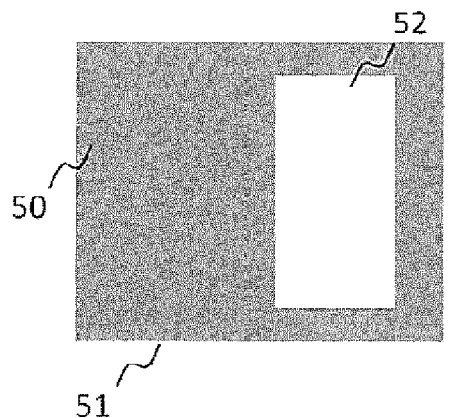
FIG. 21A is a diagram illustrating an example of an image acquired under a first observation condition according to the fifth embodiment.
Figure 21B:
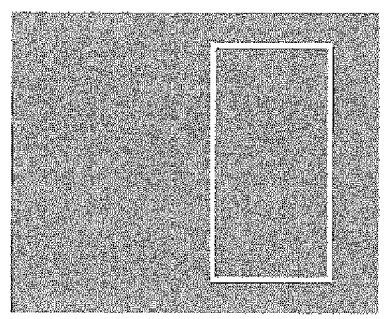
FIG. 21B is a diagram illustrating an example of an image acquired under a second observation condition according to the fifth embodiment.
Figure 21C:
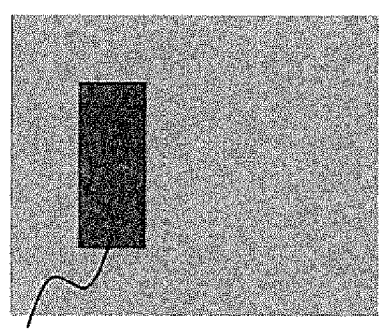
FIG. 21C is a diagram illustrating an example of an image acquired under a third observation condition according to the fifth embodiment.

Images acquired under the individual conditions are illustrated in FIGS. 21A, 21B, and 21C, respectively. FIG. 21A illustrates an image observed under the first observation condition 201. In the first observation condition 201, contrast by a material of a surface is emphasized. FIG. 21B illustrates an image observed under the second observation condition 202. As described above, in the second observation condition, secondary electron emission rates of the position 53 on the dielectric material 51 and the position 54 on the dielectric material 52 are the same. At this time, contrast that does not depend on characteristics of the position 53 on the dielectric material 51 and the position 54 on the dielectric material 52 is obtained. In this embodiment, shape contrast of a surface is emphasized. FIG. 21C illustrates an image observed under the third observation condition. The third observation condition 203 is a condition in which charging of the surface by the irradiation of the electron beam induces dielectric polarization in the sample and the dielectric polarization is reflected in the secondary electron emission rate. Because the dielectric polarization depends on an internal structure and an interface, the third observation condition 203 can visualize a characteristic of a buried structure or an interface, as illustrated in FIG. 21C. As such, a plurality of observation conditions in which contrast including different sample information is obtained are set, so that an observation method in which the sample information is determined can be provided.

Sixth Embodiment

In this embodiment, a method of starting an automatic setting mode of an observation condition will be described. A device used in this embodiment is the same device as the device in the first embodiment illustrated in FIG. 2.

Figure 22:
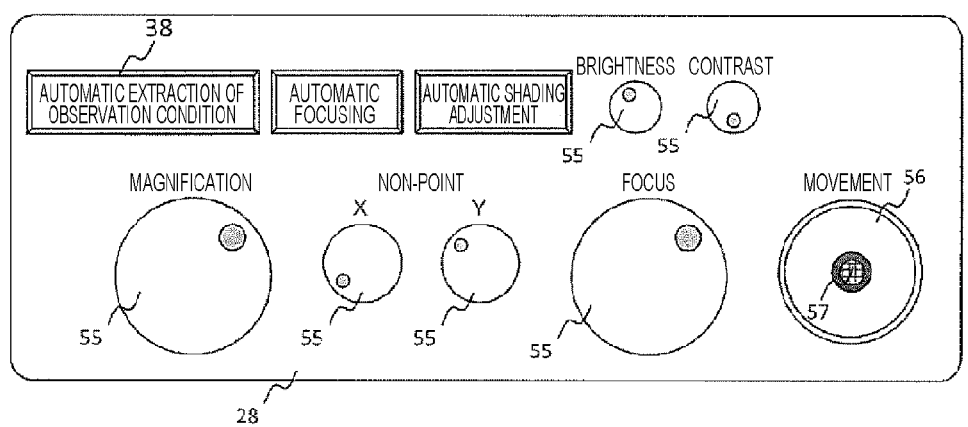
FIG. 22 is a diagram illustrating an example of an operation interface according to a sixth embodiment.

FIG. 22 illustrates a structure of an operation interface 28. A start button 38 of automatic setting of the observation condition is mounted to the operation interface 28. The automatic setting of the observation condition can be started by an adjustment knob 55 mounted to the operation interface 28 or a joystick 56 to move an observation position as well as pressing of the start button 38 of the automatic setting of the observation condition. In addition, methods of moving the observation position include a method using a track ball. For example, when the magnification is adjusted, the adjustment knob is rotated horizontally, so that the magnification can be changed. The adjustment knob of the magnification is pushed, so that a flow of the automatic setting of the observation condition starts. Because the observation condition is automatically extracted and is set to the device, according to the change in the magnification of a screen, operation stress of the user can be decreased. An automatic setting function of the same observation condition as that of the adjustment knob of the magnification adjustment is mounted to other adjustment knobs (a focus, a non-point, brightness, and contrast). A start button 57 of the automatic setting of the observation condition is mounted to the joystick 56. As the operation interface 28 illustrated in this embodiment, an operation interface of a controller type or an operation interface of a touch panel type in which FIG. 22 is changed to a form of the GUI is known. As such, if this embodiment is used, because the automatic setting of the observation condition is given in the course of operating the SEM by the user, operability of the user can be improved.

Seventh Embodiment

In this embodiment, a method of starting automatic setting of an observation condition will be described. A device used in this embodiment is the same device as the device of the first embodiment illustrated in FIG. 2.

Figure 23:
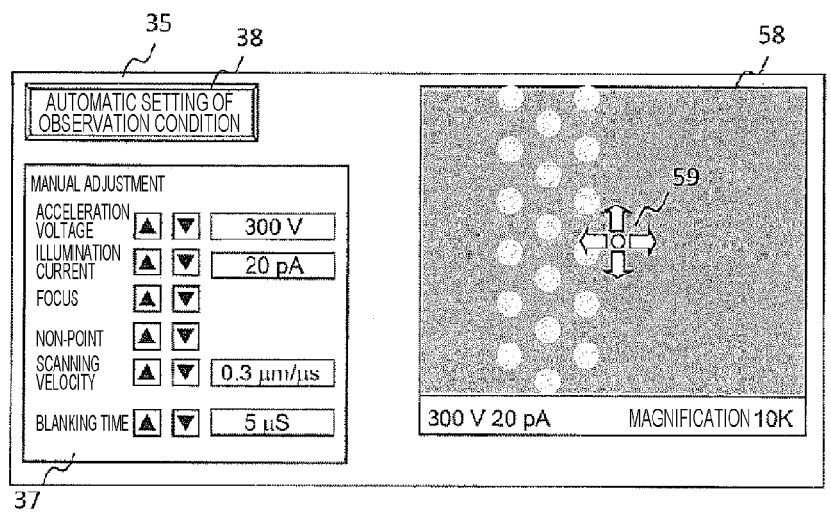
FIG. 23 is a diagram illustrating an example of an operation GUI according to a seventh embodiment.

FIG. 23 illustrates an operation GUI to be a user interface used in this embodiment. In this embodiment, starting of the automatic setting of the observation condition is given to an image display unit 58. In the image display unit 58 according to this embodiment, a screen is operated, so that a magnification change and a movement of an observation position are enabled. An instruction icon 59 (in this embodiment, a movement icon of an observation position) for an operation on the image display unit 58 is displayed. If the screen is clicked in a state in which the instruction icon 59 is displayed, the observation position moves. If double clicking is performed at the observation position, the automatic setting of the observation condition starts. The instruction icon 59 can switch a mode into the change of the magnification and the automatic setting of the observation condition is started by the double clicking after the change of the magnification is instructed. In this embodiment, the operation by the instruction icon 59 has been described. However, a touch panel type in which the image display unit 58 is operated by a finger may be used. In the touch panel type, the change of the magnification and the movement of the observation position are enabled by a touch operation on the image display unit 58. In starting of the automatic setting of the observation condition, a method of tapping the image display unit 58 is used. As such, if this embodiment is used, a step of starting the automatic setting of the observation condition is given in the course of the observation. Therefore, operability of the user can be improved.

REFERENCE SIGNS LIST 1 sample
2 pulse electron
3 flat portion
4 end portion
11 electron gun
12 pulse electron generator
13 diaphragm
14 deflector
15 objective lens
16 detector
17 sample holder
18 sample
19 device control unit
20 electron gun control unit
21 pulse electron control unit 22 deflection scanning signal control unit
23 objective lens coil control unit
24 detector control unit
25 detection signal processing unit
26 adjustment parameter analyzing unit
27 image forming unit
28 operation interface
29 image display unit
30 silicon substrate
31 insulating film
32, 33 contact plug
34 wiring line
35 operation GUI
36 image display unit
37 manual adjustment
38 start button
39a first observation condition
40a second observation condition
41a third observation condition
39b image acquired under first observation condition
40b image acquired under second observation condition
41b image acquired under third observation condition
42 combined image
43 magnetic material
44 conductor
45 insulator
46 detector
47 operation GUI
48 button
49 button
50 insulating film
51, 52 dielectric material
53, 54 position
55 adjustment knob
56 joystick
57 start button
58 image display unit
59 instruction icon
201 first observation condition
202 second observation condition
203 third observation condition

The invention claimed is:

1. A setting method of an observation condition of an electronic microscope to irradiate a sample surface with an electron beam, detect an emission electron from the sample by the irradiation of the electron beam, process a detection signal of the emission electron, and form an image by the detection signal, the setting method comprising:
a step of intermittently irradiating a predetermined position in an observation region of the sample with the electron beam;
a step of detecting a time change of the emission electron from the sample by the intermittent irradiation; and
a step of setting the observation condition from the time change of the emission electron.

2. The setting method according to claim 1, wherein the predetermined position is a plurality of positions in which a characteristic of the sample or a peripheral portion of the sample is different and the intermittent irradiation is irradiation of an intermittent pulsed electron beam.

3. The setting method according to claim 2, wherein an irradiation condition of the intermittent pulsed electron beam is a first irradiation condition to be an irradiation electron number in which a surface of the sample is not charged by the irradiation of the electron beam and a second irradiation condition to be an irradiation electron number in which the surface of the sample is charged by the irradiation of the electron beam.

4. The setting method according to claim 1, wherein the step of the intermittent irradiation of the electron beam is irradiating a fixed position in the observation region with the electron beam several times, under a plurality of intermittent conditions in which an irradiation time or an interruption time of the electron beam is different.

5. The setting method according to claim 1, wherein, in the step of the intermittent irradiation of the electron beam, a plurality of intermittent conditions in which an irradiation time or an interruption time of the electron beam is different are a first intermittent condition to be an irradiation time of the electron beam irradiated with an electron number equal to or more than 200 and equal to or less than 10,000 and a second intermittent condition to be the irradiation time of the electron beam irradiated with an electron number equal to or more than 10 and less than 200 and the intermittent time from the irradiation under the first intermittent condition to the irradiation under the second intermittent condition is a time interval from 1 ns to 1 s.

6. The setting method according to claim 5, wherein the irradiation time under the first intermittent condition is a time longer than the irradiation time under the second intermittent condition.

7. The setting method according to claim 1, wherein the predetermined position in the observation region is a plurality of positions and the observation condition is set from time changes of emission electrons of the plurality of positions.

8. The setting method according to claim 1, wherein the observation condition is any one of selection of a detector, a focus, a non-point, an acceleration voltage, an illumination current, a scanning velocity, an interruption time of an electron beam, an integration number of an image, gain of the detector, and an offset value of a detection signal.

9. The setting method according to claim 1, wherein a fixed position in the observation region is set on the basis of structure information of the sample or an optical microscope image of the sample.

10. A sample observation method using an electronic microscope to irradiate a sample surface with an electron beam, detect an emission electron from the sample by the irradiation of the electron beam, process a detection signal of the emission electron, and form an image by the detection signal, the sample observation method comprising:
a step of intermittently irradiating a predetermined position in an observation region of the sample with the electron beam;
a step of detecting a time change of the emission electron from the sample by the intermittent irradiation;
a step of setting an observation condition from the time change of the emission electron;
a step of acquiring an image under the observation condition; and
a step of displaying the image.

11. The sample observation method according to claim 10, wherein the step of setting the observation condition from the time change of the emission electron and the step of acquiring the image by the observation condition are processed several times under different intermittent conditions.

12. The sample observation method according to claim 11, further comprising:
a step of displaying the image in the priority order based on the observation condition.

13. The sample observation method according to claim 11, further comprising:

a step of integrating the plurality of images acquired by processing the steps several times, on the basis of the observation condition.

14. The sample observation method according to claim 10, wherein the pre-determined position in the observation region of the sample is a position of a pixel, the observation condition is extracted from the time change of the emission electron, for each pixel, and an image is formed.

15. An electronic microscope that irradiates a sample surface with an electron beam, detects an emission electron from the sample by the irradiation of the electron beam, processes a detection signal of the emission electron, and forms an image by the detection signal, the electronic microscope comprising:
- a means for emitting an electron beam;
- a means for controlling an irradiation position of the electron beam;
- a means for irradiating a sample with the electron beam;
- a means for detecting the emission electron from the sample;
- a means for holding the sample and moving the sample;
- a means for intermittently emitting the electron beam;
- a means for setting an intermittent condition of the electron beam;
- a means for analyzing a time change of the emission electron;
- a means for setting the observation condition on the basis of a result of the analysis;
- a means for starting a sequence to set the observation condition;
- a means for acquiring an image under the observation condition; and
- a means for displaying the image.

16. The electronic microscope according to claim 15, wherein the means for detecting the emission electron is any one of a secondary electron detector, a reflected electron detector, an electron backscatter diffraction detector, and a spin detector.

17. The electronic microscope according to claim 15, wherein the means for starting the sequence to set the observation condition is included in a user interface of the electronic microscope.

* * * * *